US010424590B2

(12) United States Patent
Lee

(10) Patent No.: US 10,424,590 B2
(45) Date of Patent: Sep. 24, 2019

(54) MEMORY DEVICE AND MANUFACTURING METHOD THEREOF

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/839,429

(22) Filed: Dec. 12, 2017

(65) Prior Publication Data

US 2018/0102378 A1 Apr. 12, 2018

Related U.S. Application Data

(62) Division of application No. 15/217,290, filed on Jul. 22, 2016, now Pat. No. 9,881,931.

(30) Foreign Application Priority Data

Mar. 11, 2016 (KR) .................. 10-2016-0029677

(51) Int. Cl.
*H01L 27/11565* (2017.01)
*H01L 27/1157* (2017.01)
*H01L 27/11573* (2017.01)
*H01L 27/11582* (2017.01)

(52) U.S. Cl.
CPC .... *H01L 27/11565* (2013.01); *H01L 27/1157* (2013.01); *H01L 27/11573* (2013.01); *H01L 27/11582* (2013.01)

(58) Field of Classification Search
None
See application file for complete search history.

(56) References Cited

U.S. PATENT DOCUMENTS

2010/0181610 A1 7/2010 Kim et al.
2015/0055413 A1 2/2015 Alsmeier
2015/0380418 A1 12/2015 Zhang et al.

FOREIGN PATENT DOCUMENTS

KR 1020120029194 A 3/2012

*Primary Examiner* — Long Pham
(74) *Attorney, Agent, or Firm* — William Park & Associates Ltd.

(57) ABSTRACT

There are provided a memory device and a manufacturing method thereof. A method of manufacturing a memory device may include forming, on a substrate, a conductive layer, a sacrificial layer, and a stack structure. The method may include forming a plurality of vertical holes by etching a portion of the stack structure. The method may include forming a memory layer and a channel layer along internal surfaces of the vertical holes. The method may include forming a slit trench exposing a portion of the sacrificial layer therethrough by etching a portion of the stack structure between the vertical holes. The method may include exposing a portion of the channel layer and the first conductive layer through a lower portion of the stack structure by removing portions of the sacrificial layer and the memory layer. The method may include forming another conductive layer along surfaces of the exposed portion of the channel layer and the first conductive layer. The method may include forming a slit insulating layer in the slit trench.

15 Claims, 18 Drawing Sheets

MEMORY DEVICE AND MANUFACTURING METHOD THEREOF

CROSS-REFERENCE TO RELATED APPLICATION

The present application is a divisional application of U.S. application Ser. No. 15/217,290 filed on Jul. 22, 2016 and claims priority under 35 U.S.C. § 119(a) to Korean patent application number 10-2016-0029677 filed on Mar. 11, 2016 in the Korean Intellectual Property Office, the entire disclosure of which is incorporated herein by reference.

BACKGROUND

1. Technical Field

An aspect of the present disclosure generally relates to a memory device and a manufacturing method thereof, and more particularly to a three-dimensional memory device and a manufacturing method thereof.

2. Related Art

A memory system may include a memory device for storing data and a memory controller for controlling the memory device.

Examples of the memory device may include a volatile memory device and a nonvolatile memory. The volatile memory device is a memory device that only retains its data while it is powered. The nonvolatile memory is a memory device that can retain its data even in the absence of a power source.

As portable electronic devices are widely used, nonvolatile memory devices are widely used as data storage devices.

Among nonvolatile memory devices, flash memory devices are frequently used in portable electronic devices.

A flash memory device may include a memory cell array for storing data, peripheral circuits for performing program, read, and erase operations, and a control logic for controlling the peripheral circuits.

For example, a memory cell array of NAND flash memory device may include a plurality of memory blocks, and each of the memory blocks may include a plurality of memory cell strings. Memory devices may be classified into two-dimensional and three-dimensional memory devices depending on structures of memory cell strings.

A two-dimensional memory device may include memory cell strings horizontally arranged over a substrate, and a three-dimensional memory device may include memory cell strings vertically arranged from a substrate.

SUMMARY

According to an aspect of the present disclosure, a memory device may include a source line, a plurality of memory cell strings, a slit trench, and a slit insulating layer. The source line may be formed on a substrate. The plurality of memory cell strings may be formed over the source line. The slit trench may be formed between the memory cell strings. The slit insulating layer may be formed to fill at least a portion of the slit trench.

According to an aspect of the present disclosure, there is provided a method of manufacturing a memory device. The method may include forming, on a substrate, a conductive layer, a sacrificial layer, and a stack structure; forming a plurality of vertical holes by etching a portion of the stack structure. The method may include forming a memory layer and a channel layer along internal surfaces of the vertical holes. The method may include forming a slit trench exposing a portion of the sacrificial layer therethrough by etching a portion of the stack structure between the vertical holes. The method may include exposing a portion of the channel layer and the conductive layer through a lower portion of the stack structure by removing portions of the sacrificial layer and the memory layer. The method may include forming another conductive layer along surfaces of the exposed portion of the channel layer and the first conductive layer. The method may include forming a slit insulating layer in the slit trench.

DETAILED DESCRIPTION

Figure 1:
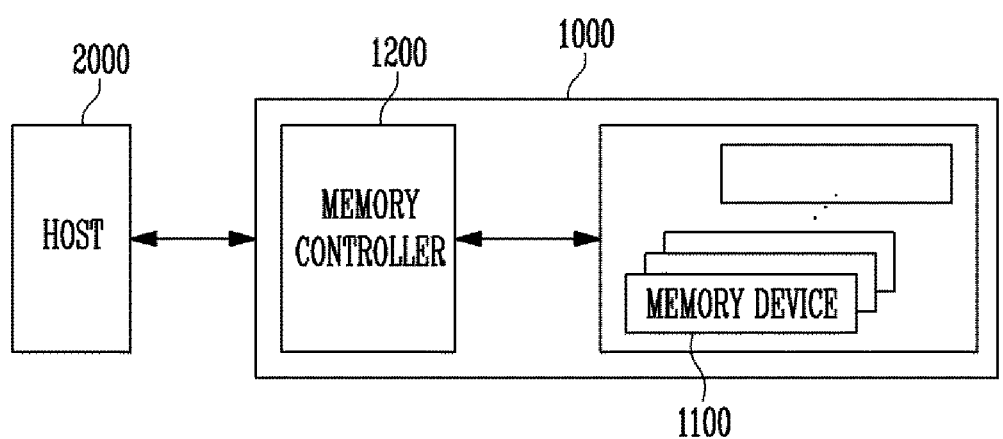
FIG. 1 is a diagram illustrating an example of a memory system according to the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art.

FIG. 1 is a diagram illustrating an example of a memory system according to the present disclosure.

Referring to FIG. 1, the memory system 1000 may include memory devices 1100 for storing data and a memory controller 1200 for controlling the memory devices 1100.

In an embodiment, the memory devices 1100 may be flash memory devices. For example, the memory devices 1100 may be NAND flash memory devices.

The memory controller 1200 may control operations of the memory devices 1100. In response to a command received from the host 2000, the memory controller 1200 may output, to the memory devices 1100, a command for controlling the memory devices 1100, an address, and data. The memory controller 1200 may also output data received from the memory devices 1100 to a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS).

Figure 2:
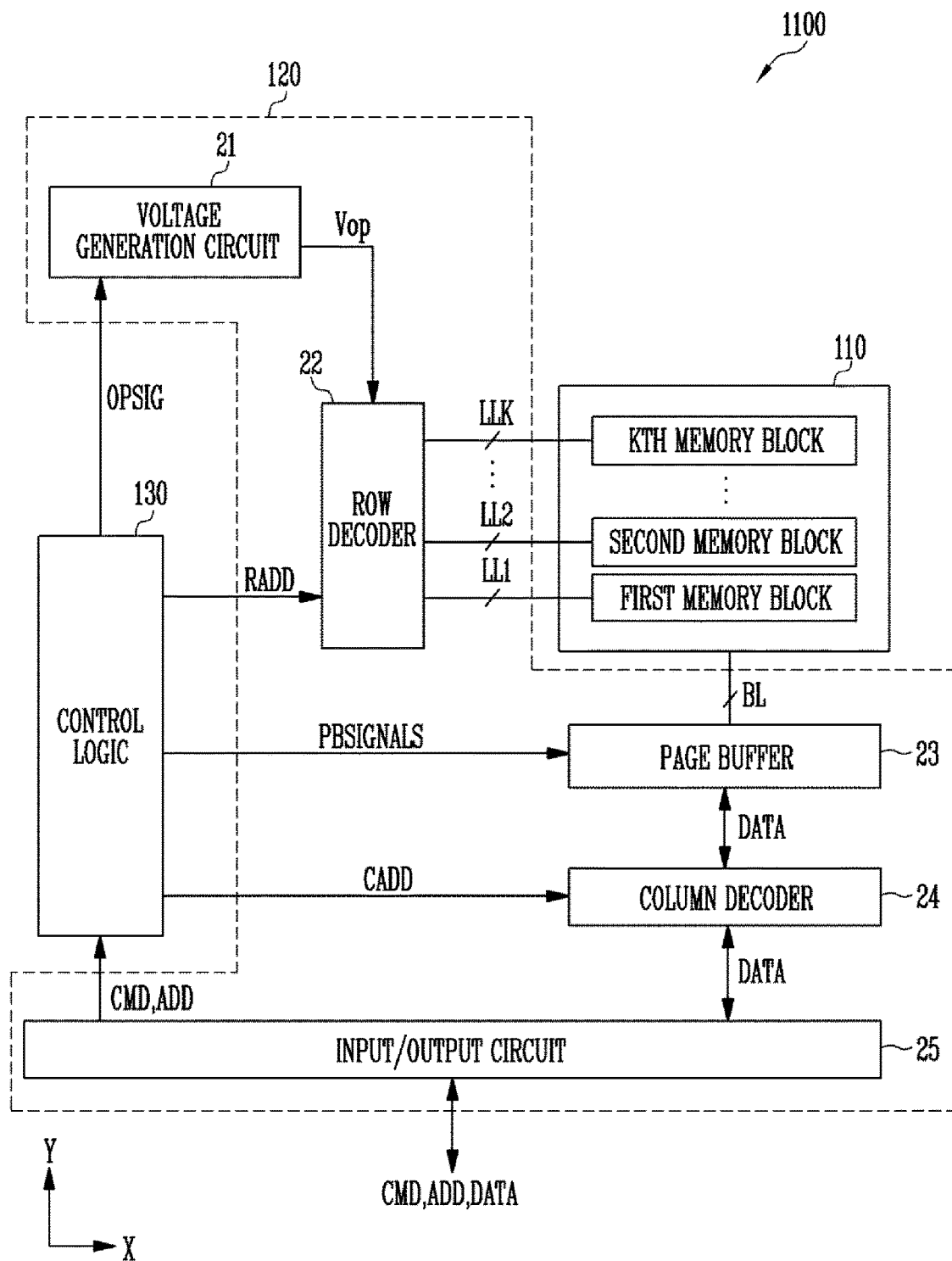
FIG. 2 is a diagram illustrating an example of a memory device of FIG. 1.

FIG. 2 is a diagram illustrating an example of a memory device of FIG. 1.

Referring to FIG. 2, the memory device 1110 may include a memory cell array 110 for storing data, a peripheral circuit 120 for performing a program, read, and erase operation of the memory cell array 110, and a control circuit 130 for controlling the peripheral circuit 120.

Memory cells of the semiconductor memory device 1100 may be arranged in the memory cell array 110. The memory cells of the memory cell array 110 may be grouped into first to $K^{th}$ memory blocks (K is a positive integer). The first to $K^{th}$ memory blocks may be connected to first to $K^{th}$ local lines LL1 to LLK, respectively. The first to $K^{th}$ memory blocks may be formed in a three-dimensional structure. The first to $K^{th}$ memory blocks may be configured identically to each other.

The peripheral circuit 120 may include a voltage generation circuit 21, a row decoder 22, a page buffer 23, a column decoder 24, and an input/output circuit 25.

The voltage generation circuit 21 may generate operating voltages Vop having various levels in response to an operation signal OPSIG, and may selectively apply the generated operating voltages Vop to global lines. In response to an operation signal OPSIG corresponding to a program, read, or erase operation, the voltage generation circuit 21 may generate operating voltages Vop having various levels required to perform the program, read, or erase operation.

The row decoder 22 may apply the operating voltage Vop to local lines coupled to a selected memory block, among the first to $K^{th}$ local lines LL1 to LLK, in response to a row address RADD. For example, the row decoder 22 may be coupled to the voltage generation circuit 21 through the global lines. The row decoder 22 may apply the operating voltages Vop received through the global lines to the local lines coupled to the selected memory block.

The page buffer 23 may be coupled to the memory cell array 110 through bit lines BL. In response to a page buffer control signal PBSIGNALS, the page buffer 23 may precharge the bit lines BL with a positive voltage, and transmit/receive data to/from the selected memory block in the program and read operations. The page buffer 23 may also temporarily store the transmitted data in response to the page buffer control signal PBSIGNALS.

The column decoder 24 may be used to select a column (e.g., a page buffer coupled to a column). The column decoder 24 may also be used to exchange data between the page buffer 23 and the input/output circuit 25. For example, data DATA may be transferred through the column decoder 24 in response to a column address CADD.

The input/output circuit 25 may transmit, to the control logic 130, a command CMD and an address ADD, which are transmitted from the memory controller 1200. The input/output circuit 25 may also transmit data DATA to the column decoder 24, and output data DATA transmitted from the column decoder 24 to the memory controller 1200.

The control logic 130 may control the peripheral circuit 120 in response to the command CMD and the address ADD. For example, the control logic 130 may output the operation signal OPSIG, the row address RADD, the page buffer control signal PBSIGNALS, and the column address CADD to control the peripheral circuit 120 in response to the command CMD and the address ADD.

In an embodiment, the memory cells of the semiconductor memory device 1100, which are grouped into the first to $K^{th}$ memory blocks, may be arranged in a three-dimensional structure. Hereinafter, one of the first to $K^{th}$ memory blocks will be described as an example.

Figure 3:
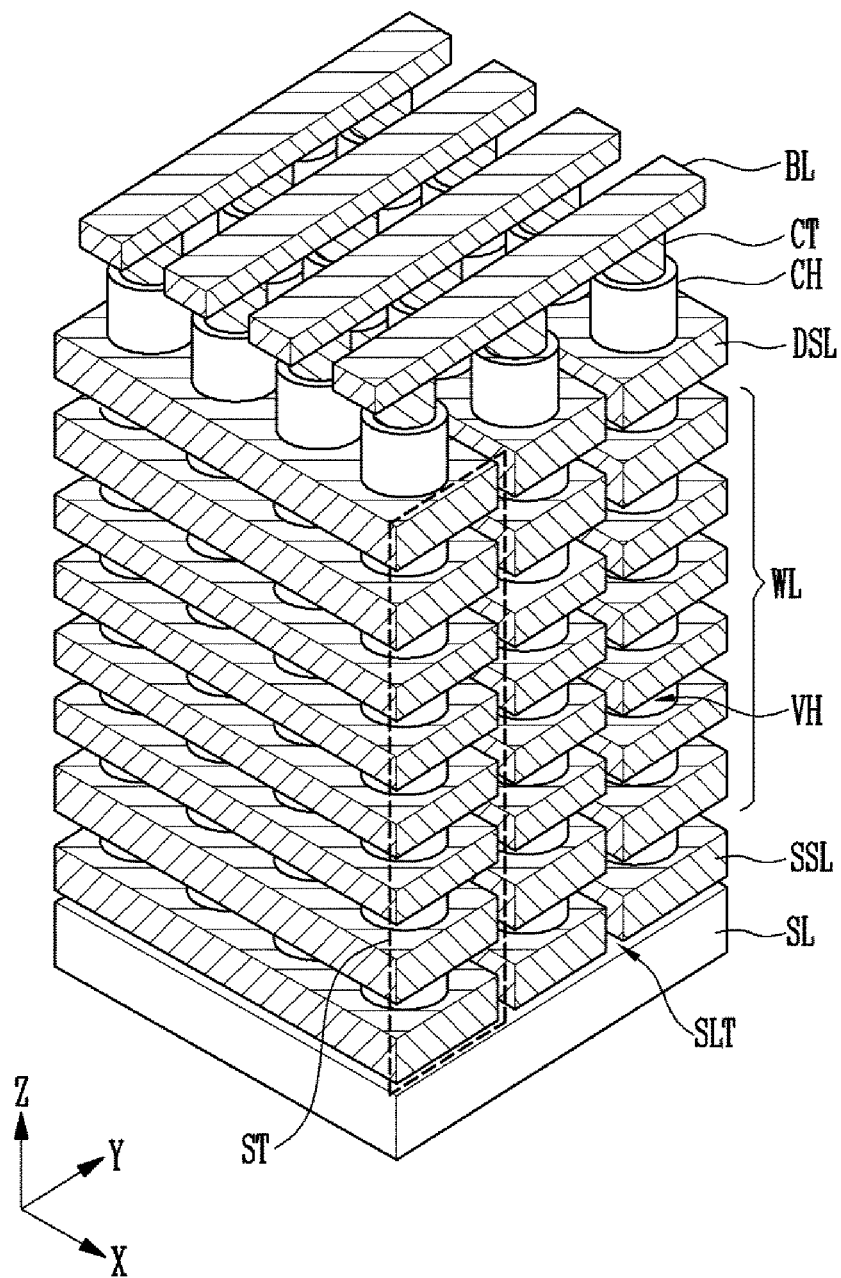
FIG. 3 is a perspective view illustrating an example of a memory block having a three-dimensional structure according to an embodiment of the present disclosure.

FIG. 3 is a perspective view illustrating an example of a memory block having a three-dimensional structure according to an embodiment of the present disclosure.

Referring to FIG. 3, the memory block having the three-dimensional structure may include a plurality of memory cell strings ST arranged vertically (e.g., in a Z direction) on a substrate. The memory cell strings ST may be formed vertically between bit lines BL and a source line SL. For example, when the source line SL is horizontally formed over the substrate, the vertical strings may be formed in the vertical direction (e.g., Z direction) over the source line SL. More specifically, the vertical memory cell strings may include source select lines SSL, word lines WL, and drain select lines DSL, which are stacked to be spaced apart from each other. Although not illustrated, the vertical memory cell strings may further include dummy select lines or dummy word lines.

In an intermediate structure or in a final structure, the vertical memory cell strings may include vertical holes VH vertically penetrating the source select lines SSL, the word lines WL, and the drain select lines DSL. The vertical memory cell strings may include vertical channel layers CH formed inside the respective vertical holes VH to come in contact with the source line SL. Source select transistors may be formed between the vertical channel layers CH and the source select lines SSL. Memory cells may be formed between the vertical channel layers CH and the word lines WL. Drain select transistors may be formed between the vertical channel layers CH and the drain select lines DSL.

The bit lines BL may be in contact with the top ends of the vertical channel layers CH extending upwardly from the source line SL from the drain select lines DSL. The bit lines BL may extend along a Y direction, and may be spaced apart from each other along an X direction perpendicular to the Y direction. The source select lines SSL, the word lines WL, and the drain select lines DSL may be arranged along the X direction, and may be spaced part from each other along the Y direction. Contact plugs CT may be further formed between the bit lines BL and the vertical channel layers CH.

In addition, a slit trench SLT vertically separating the drain select lines DSL, the word lines WL, and the source select lines SSL may be formed between some adjacent memory cell strings ST.

Figure 4:
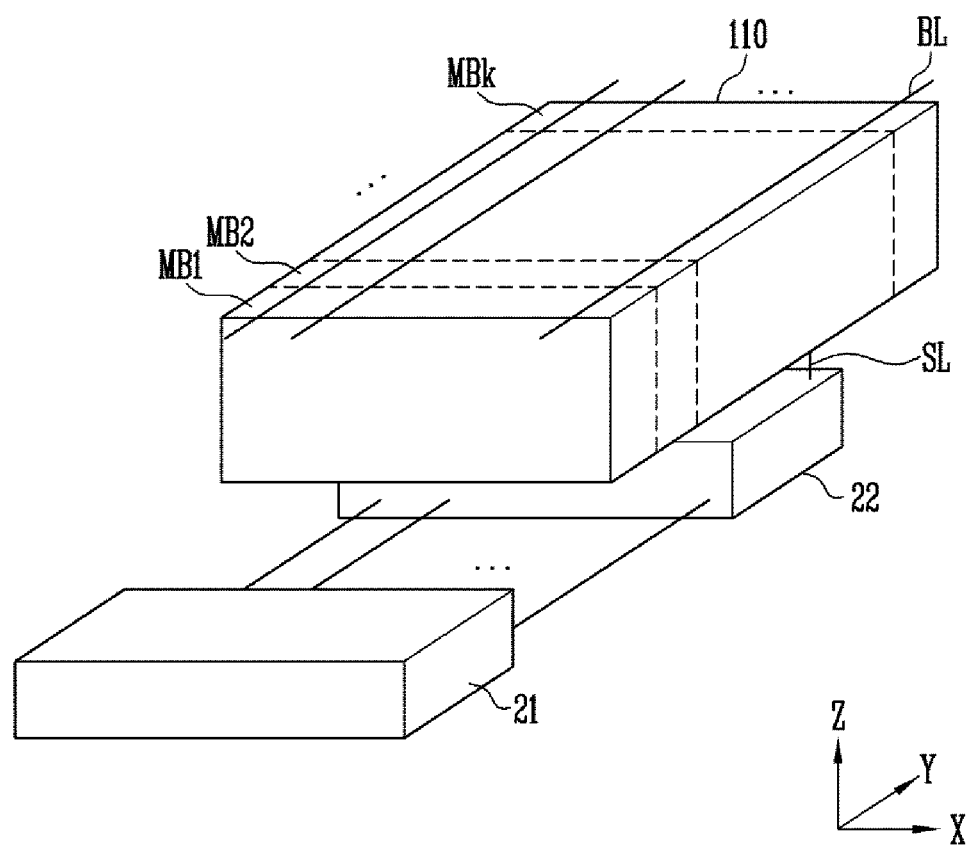
FIG. 4 is a perspective view illustrating an example configuration of a memory cell array and a peripheral circuit in FIG. 2.

FIG. 4 is a perspective view illustrating an example configuration of the memory cell array and the peripheral circuit in FIG. 2.

Referring to FIG. 4, in order to decrease the size of the memory device, the peripheral circuit 120 of FIG. 2 may be located under the memory cell array 110. In FIG. 4, the voltage generation circuit 21 and the row decoder 22, which are included in the peripheral circuit 120, are illustrated.

The memory cell array 110 may include a plurality of memory blocks MB1 to MBk (k is a positive integer). The memory blocks MB1 to MBk may share a plurality of bit lines BL and a source line SL. When the memory cell array 110 is formed in a three-dimensional structure, the bit lines BL may be arranged over the memory cell array 110, and the source line SL may be disposed under the memory cell array 110. A voltage applied to the source line SL may be generated by the voltage generation circuit 21. A source voltage generated by the voltage generation circuit 21 may be directly applied to the source line SL, or may be applied to the source line SL through the row decoder 22.

Figure 5A:
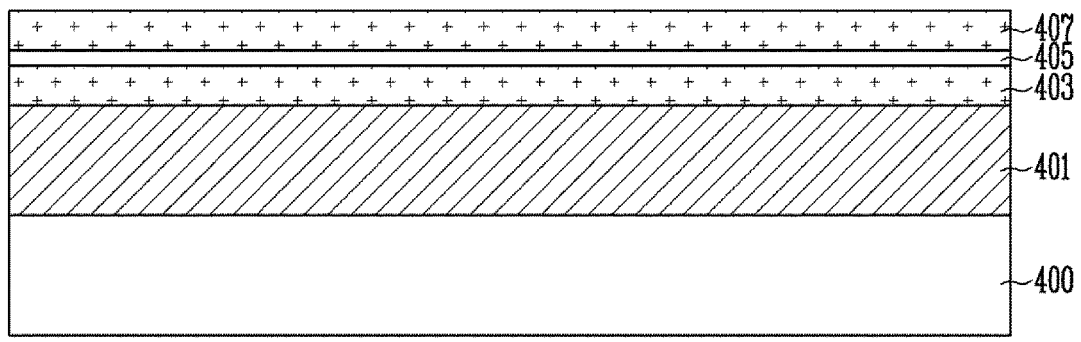
FIGS. 5A to 5N are cross-sectional views illustrating an example manufacturing method of a memory device according to an embodiment of the present disclosure.
Figure 5B:
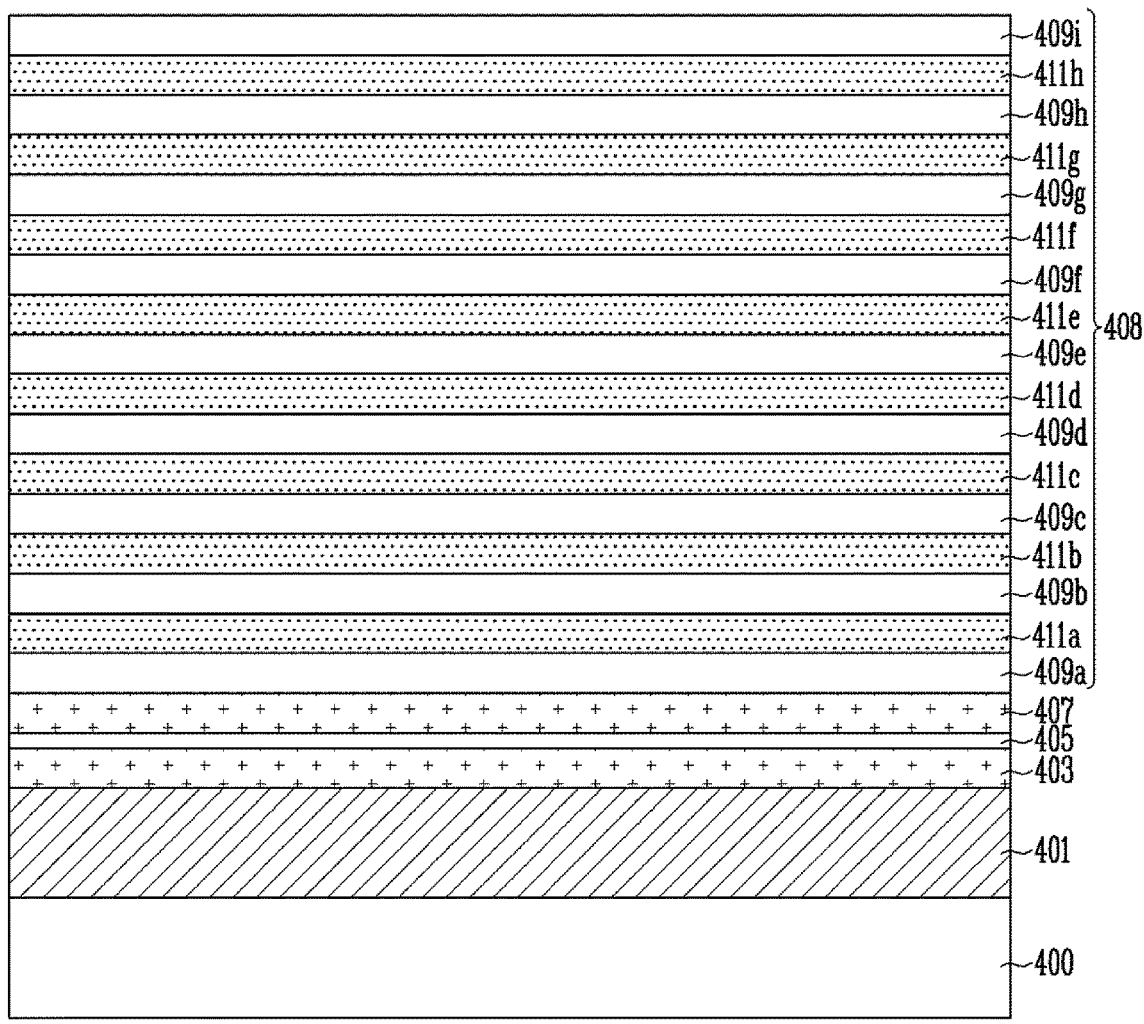
Figure 5C:
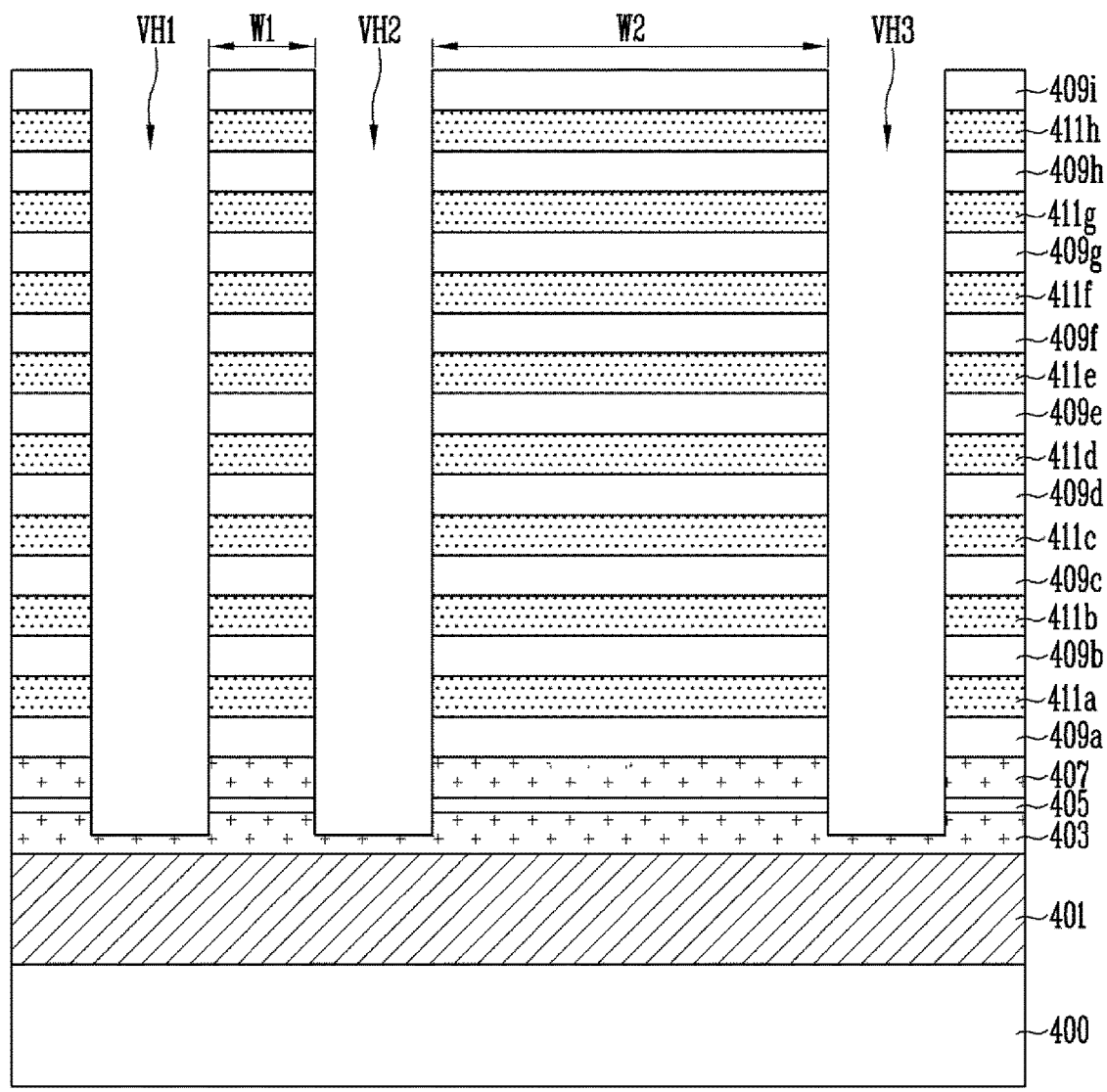
Figure 5D:
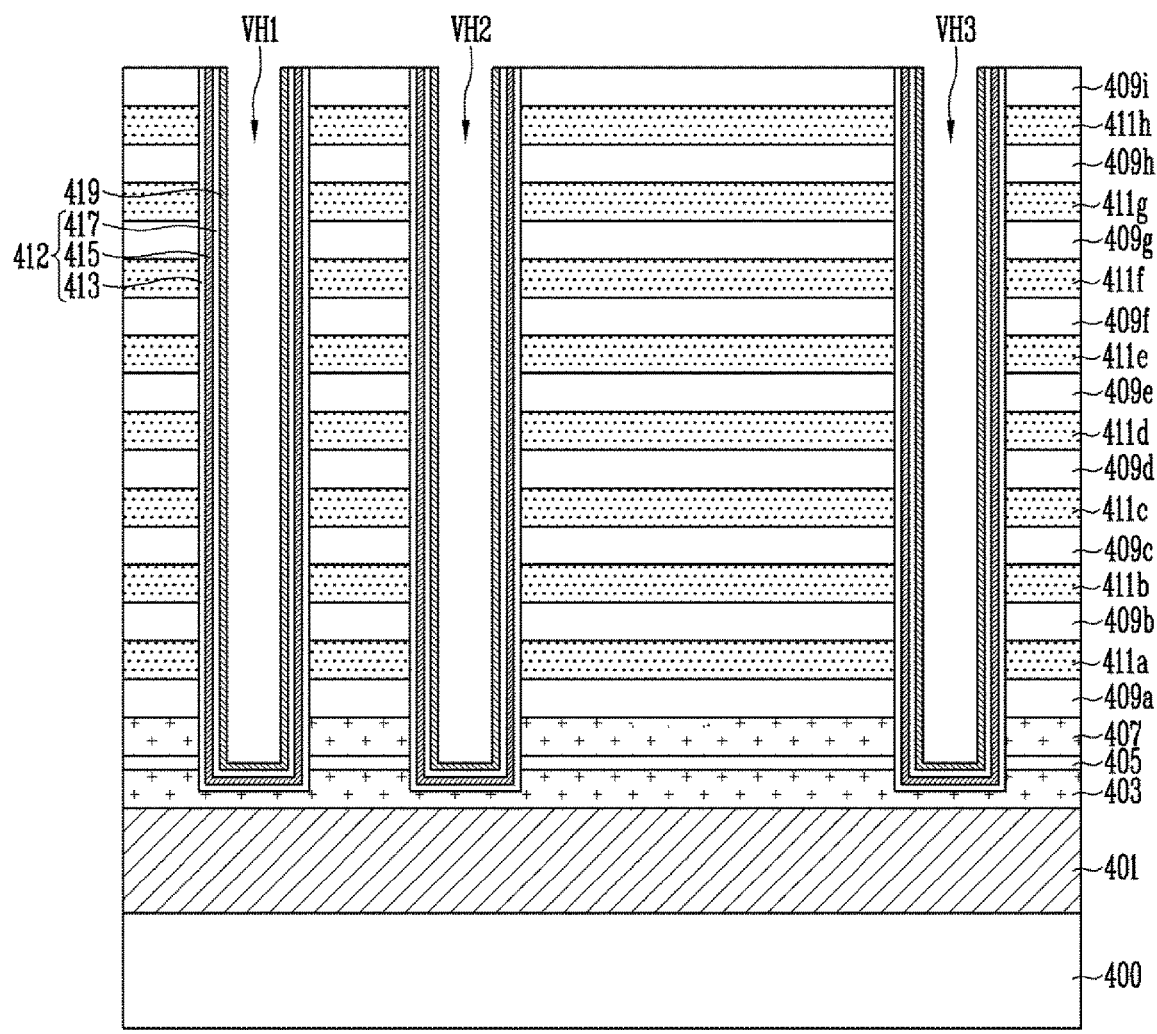
Figure 5E:
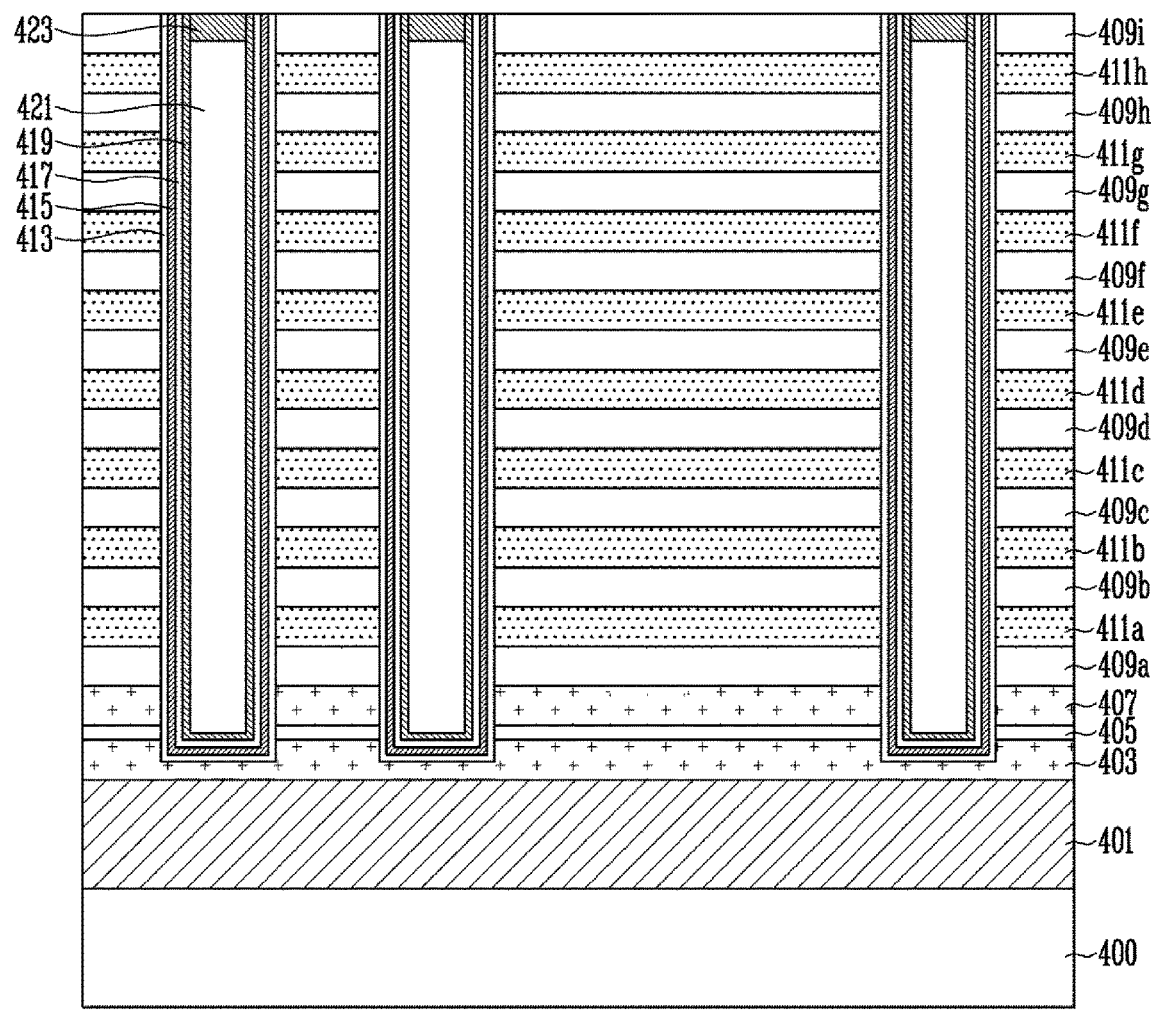
Figure 5F:
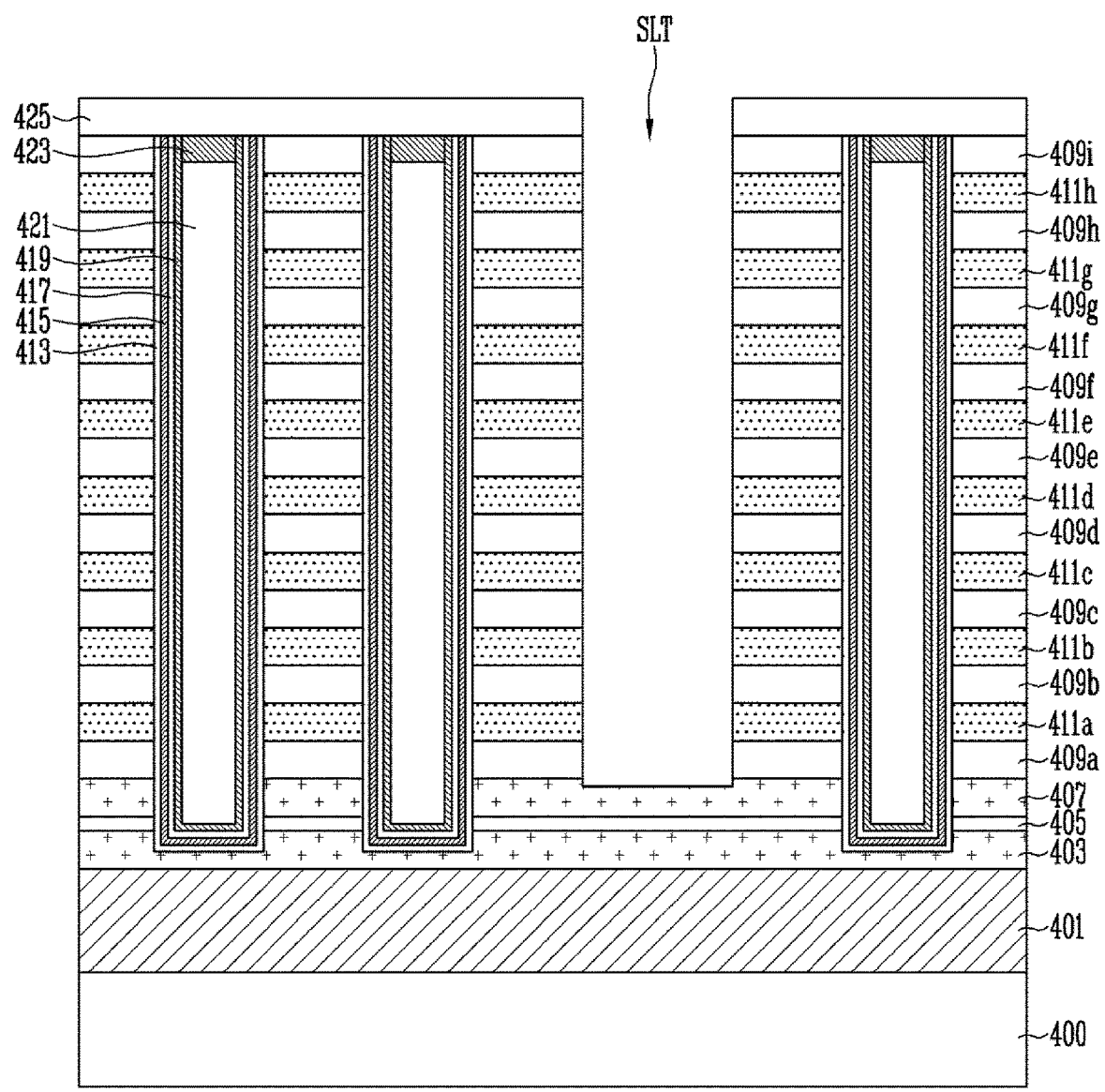
Figure 5G:
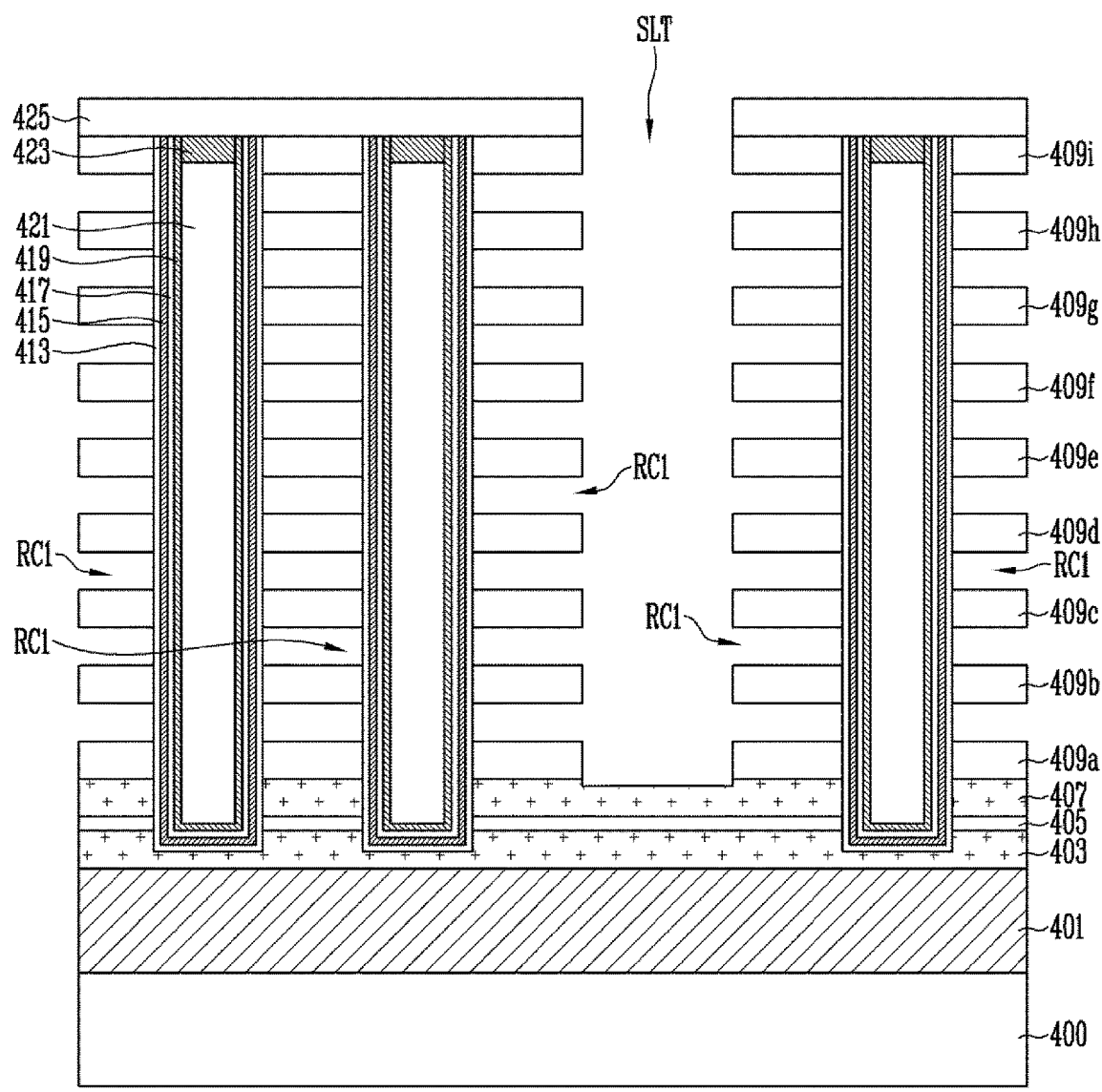
Figure 5H:
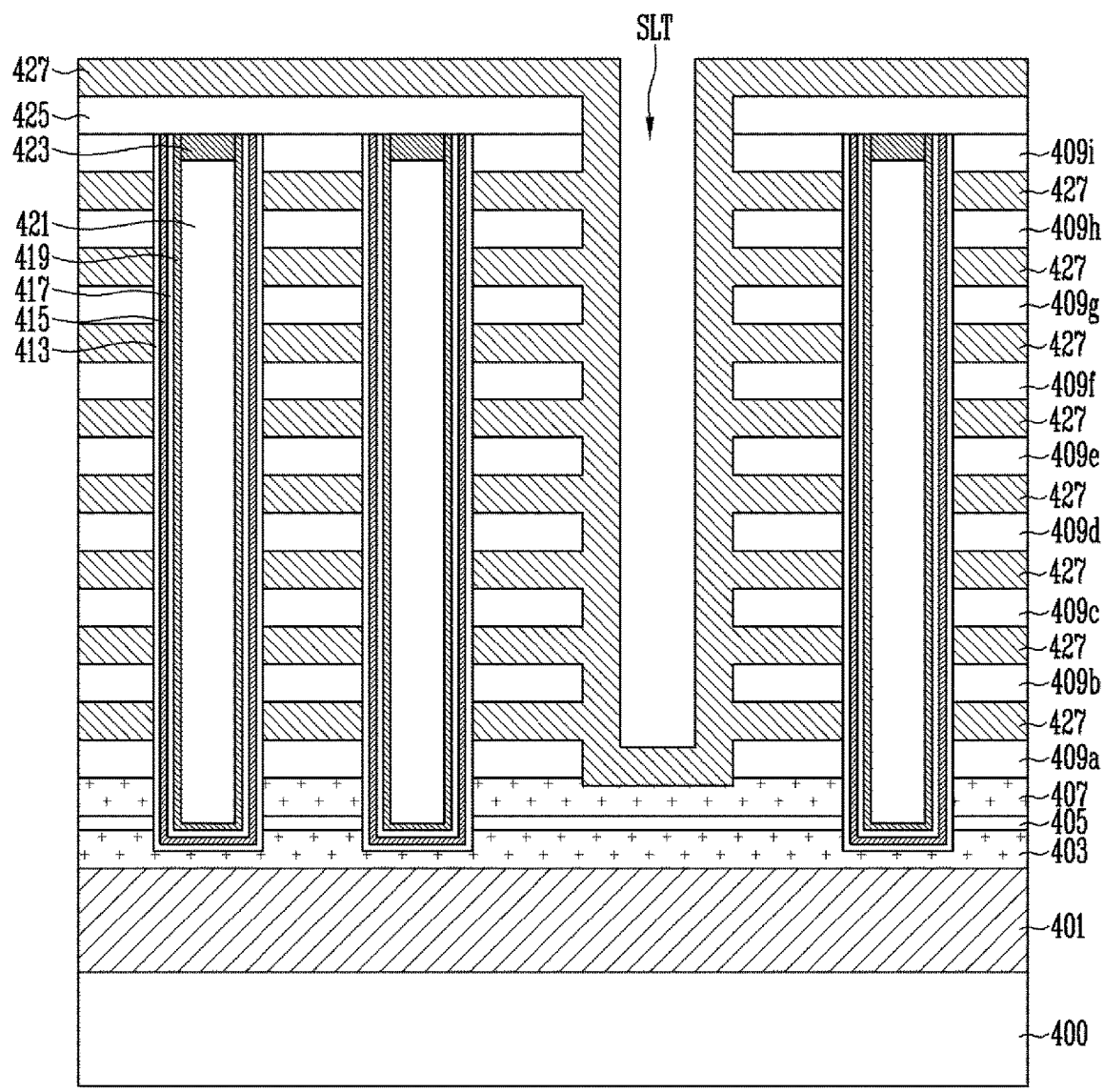
Figure 5I:
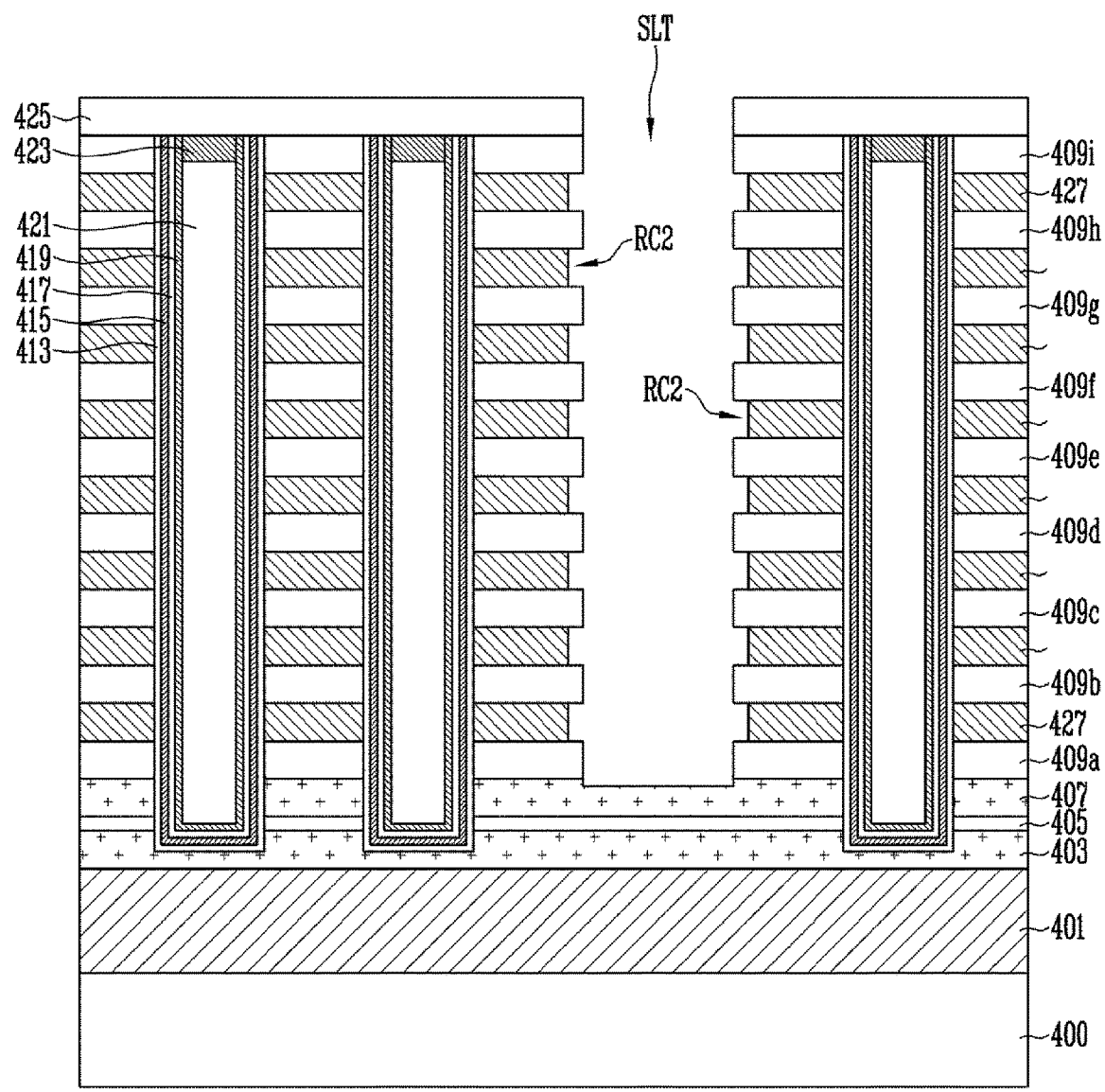
Figure 5J:
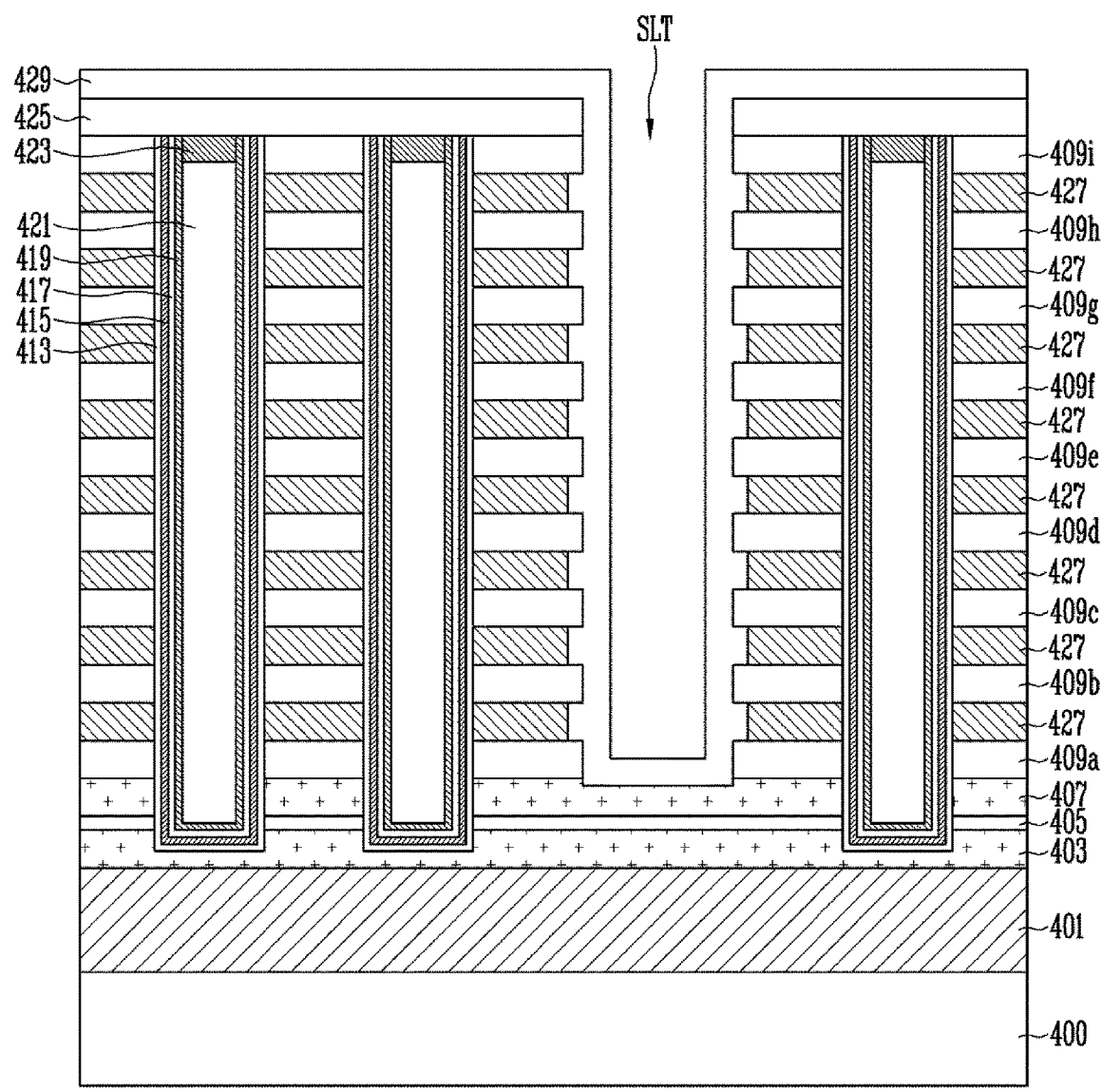
Figure 5K:
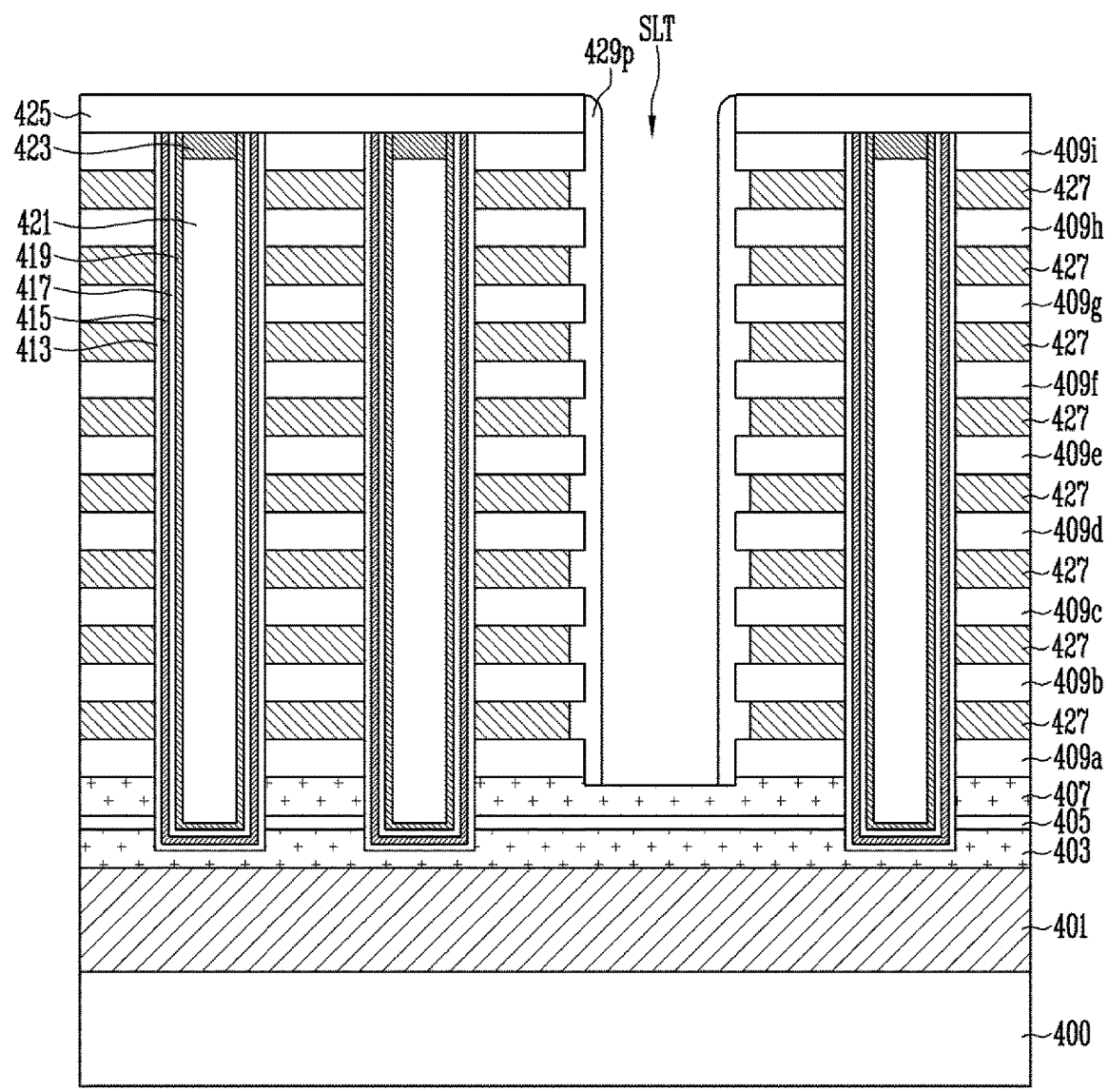
Figure 5L:
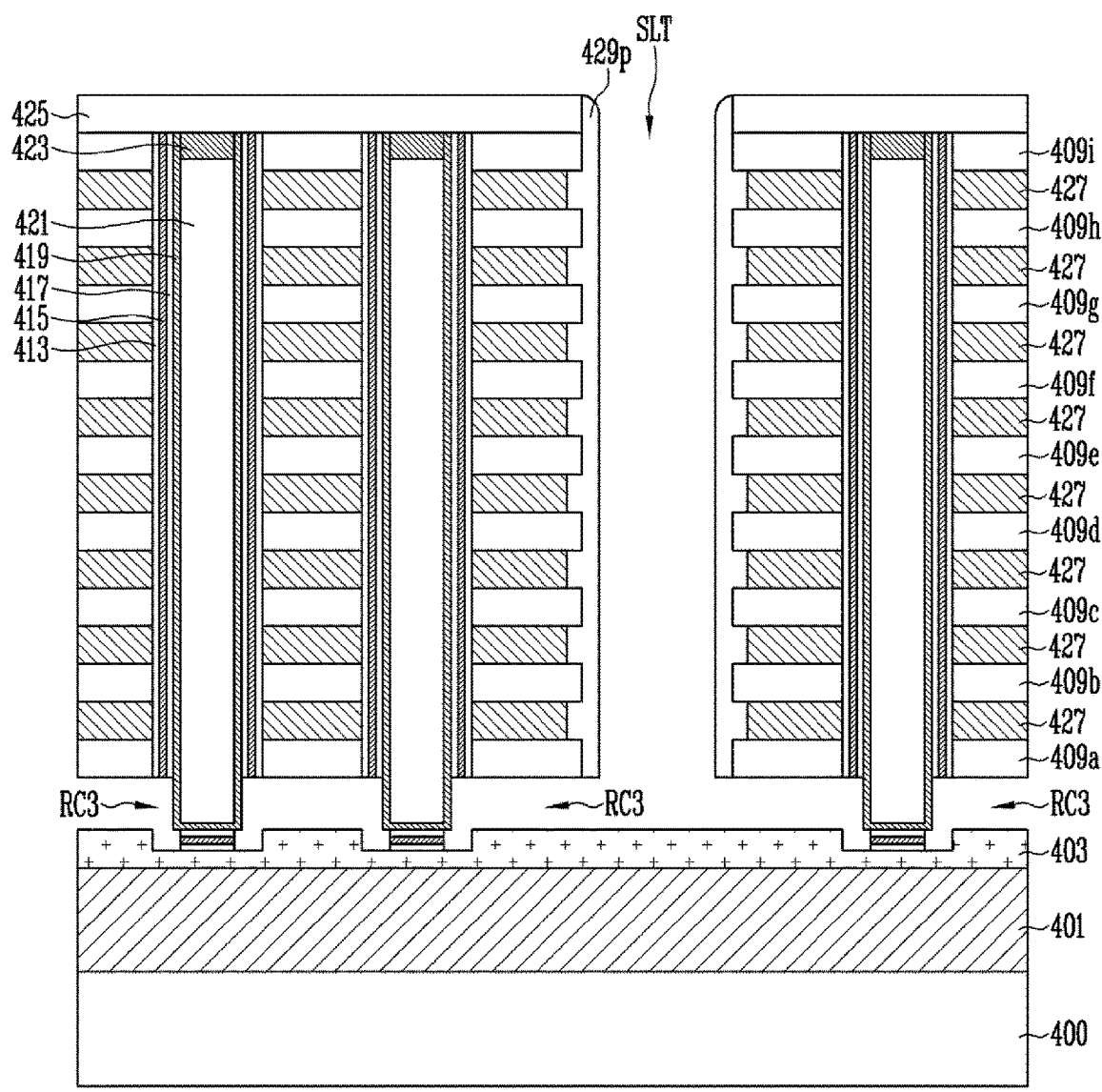
Figure 5M:
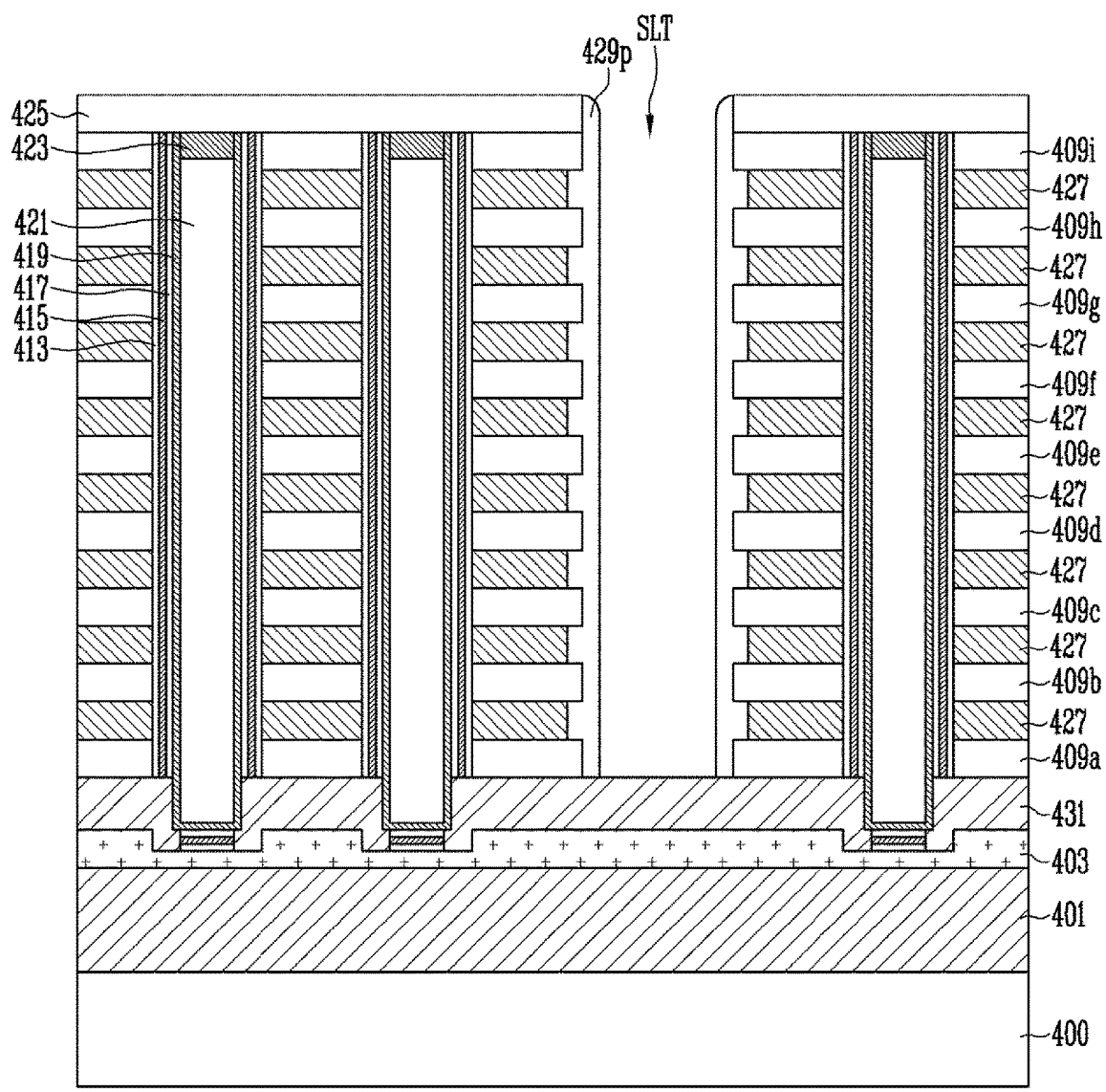
Figure 5N:
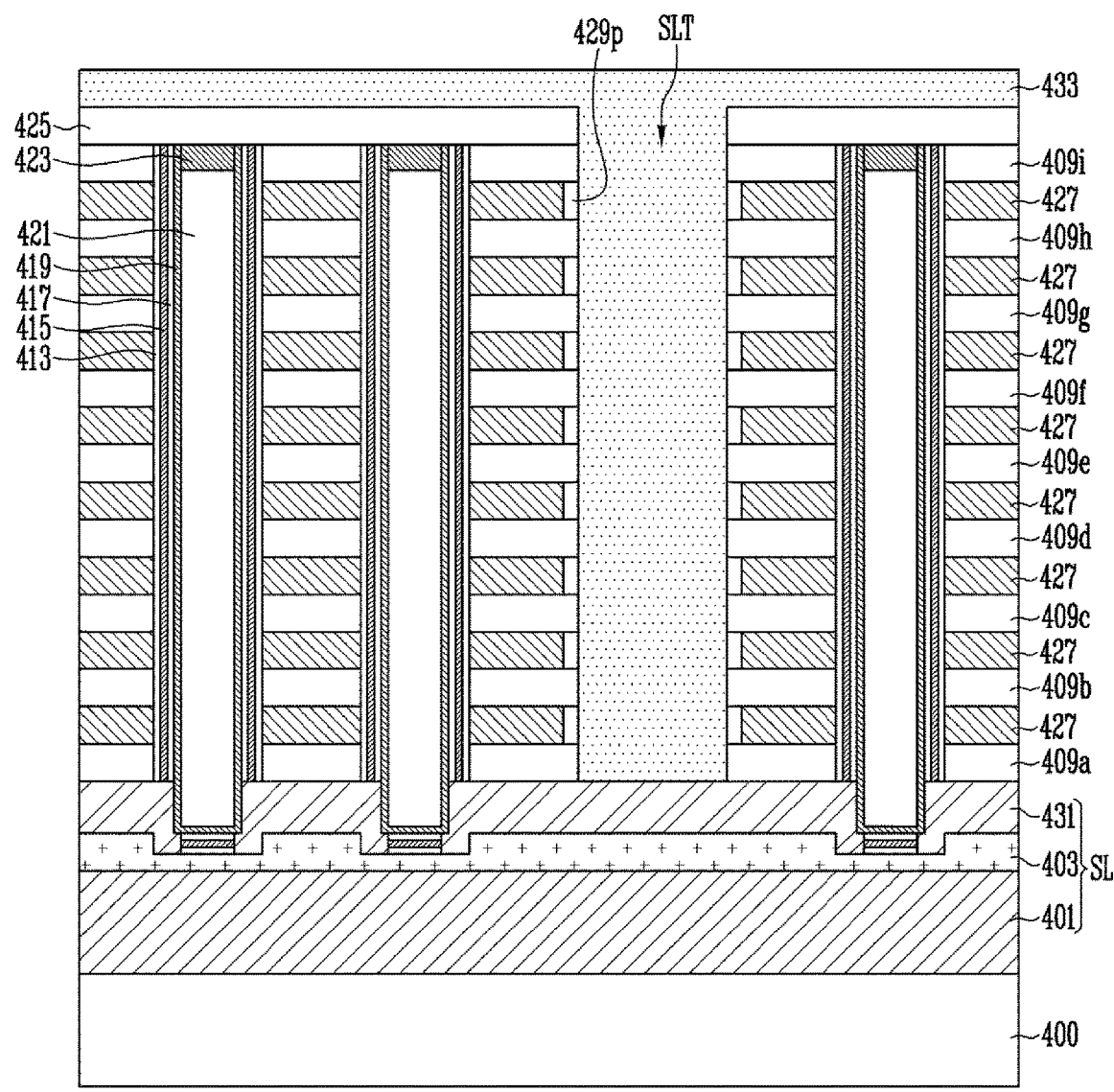

FIGS. 5A to 5N are cross-sectional views illustrating an example manufacturing method of a memory device according to an embodiment of the present disclosure.

Referring to FIG. 5A, a first conductive layer 401 for a source line is formed on a substrate 400. The substrate 400 may be a silicon substrate. The first conductive layer 401 may be formed of a conductive material. For example, the first conductive layer 401 may be formed of a tungsten silicon material (WSi), or may include a WSi layer as a part thereof. A second conductive layer 403, a buffer layer 405, and a first sacrificial layer 407 may be sequentially stacked over the first conductive layer 401. Here, the second conductive layer 403 may be used as the source line, and the buffer layer 405 may be used as an etch stop layer. The first conductive layer 401 may be formed of a conductive material. For example, the second conductive layer 403 may be formed of a polysilicon material. In this case, the second conductive layer 403 may be formed of a doped polysilicon material. The second conductive layer 403 may be used as the source line together with the first conductive layer 401. The buffer layer 405 may be formed of a material having an etch rate different from the second conductive layer 403. For example, the buffer layer 405 may be formed of an oxide material. The first sacrificial layer 407 may be formed of a polysilicon material.

Referring to FIG. 5B, a stack structure 408 is formed on the first sacrificial layer 407. The stack structure 408 may include first interlayer insulating layers 409a to 409i and second sacrificial layers 411a to 411h, which are alternately stacked on the first sacrificial layer 407.

Referring to FIG. 5C, first to third vertical holes VH1 to VH3 are formed in regions in which memory cell strings are to be formed in the stack structure 408. Although FIG. 5 illustrates only three vertical holes VH1 to VH3, the invention is not limited thereto, and more vertical holes may be formed in the stack structure 408. The first to third vertical holes VH1 to VH3 may be formed in the stack structure 408 by performing an etching process. For example, the first interlayer insulating layers 409a to 409i, the second sacrificial layers 411a to 411h, the first sacrificial layer 407, and a portion (e.g., memory cell string region) of the buffer layer 405 may be etched in a vertical direction, thereby forming the first to third vertical holes VH1 to VH3 vertically penetrating the first interlayer insulating layers 409a to 409i, the second sacrificial layers 411a to 411h, the first sacrificial layer 407, and the buffer layer 405. The first to third vertical holes VH1 to VH3 may be formed to expose the second conductive layer 403. For example, bottom ends of the first to third vertical holes VH1 to VH3 may expose the second conductive layer 403. When the distance between the first and second vertical holes VH1 and VH2 is defined as a first distance W1, the distance between the second and third vertical holes VH2 and VH3 may be defined as a second distance W2 wider than the first distance W1. The first and second distances W1 and W2 may be determined by considering a width of a slit trench to be formed in a slit region in a subsequent process.

Referring to FIG. 5D, a memory layer 412 and a channel layer 419 may be formed along internal surfaces of the first to third vertical holes VH1 to VH3. The memory layer 412 may include a blocking layer 413, a trapping layer 415, and a tunnel insulating layer 417. The blocking layer 413 may be formed of an oxide material. The trapping layer 415 may be a layer that traps electrons, and may be formed of a nitride material. The tunnel insulating layer 417 may be formed of an oxide material. The channel layer 419 may be formed of a polysilicon material. The channel layer 419 may be formed by filling all of the first to third vertical holes VH1 to VH3 with a conductive material such as the polysilicon material. Alternatively, the channel layer 419 may be formed along the surface of the memory layer 412, and part of each of the first to third vertical holes VH1 to VH3 may remain empty.

Referring to FIG. 5E, a vertical insulating layer 421 may be formed in the first to third vertical holes VH1 to VH3 having the channel layer 419 formed therein. In an embodiment, the vertical insulating layer 421 may be formed such that upper regions of the first to third vertical holes VH1 to VH3 remain empty. A capping layer 423 may be formed in the upper regions of the first to third vertical holes VH1 to VH3. The vertical insulating layer 421 may be formed of a flowable material that can fill the first to third vertical holes VH1 to VH3. For example, the vertical insulating layer 421 may be formed of polysilazane (PSZ). The capping layer 423 may be formed of the same material as the channel layer 419. For example, the channel layer 419 may be formed of a polysilicon material.

Referring to FIG. 5F, a hard mask pattern 425 having an opening may be formed over the stack structure 408. For example, the opening of the hard mask pattern 425 may be formed in a slit region, and the width of the opening may be set by considering the width of a slit trench SLT to be subsequently formed. The slit region may be defined between the second and third vertical holes VH2 and VH3. Portions of the first interlayer insulating layers 409a to 409i and the second sacrificial layers 411a to 411h, which are exposed through the opening of the hard mask pattern 425, may be etched, thereby forming the slit trench SLT in the slit region. An etching process for forming the slit trench SLT may include a wet etching process. For example, an anisotropic etching process may be performed to form the slit trench SLT such that a side wall of the slit trench SLT can be perpendicular to the substrate 400. For example, an anisotropic dry etching process may be performed to form the slit trench SLT. The etching process for forming the slit trench SLT may be performed until the first sacrificial layer 407 is exposed. Since the slit trench SLT is formed by vertically penetrating the first interlayer insulating layers 409a to 409i and the second sacrificial layers 411a to 411h, the first interlayer insulating layers 409a to 409i and the second sacrificial layers 411a to 411h may be exposed through a side surface of the slit trench SLT.

Referring to FIG. 5G, an etching process is performed to remove portions of the second sacrificial layers 411a to 411h exposed through the side surface of the slit trench SLT. In an embodiment, an isotropic etching process may be performed such that all of the second sacrificial layers 411a to 411h formed in the memory block can be removed. For example, an isotropic wet etching process may be performed. As the second sacrificial layers 411a to 411h are removed, first recesses RC1 may be formed between the first interlayer insulating layers 409a to 409i.

Referring to FIG. 5H, a third conductive layer 427 may be formed on the entire structure including the slit trench SLT such that the third conductive layer 427 fills the first recesses RC1. The third conductive layer 427 may be a conductive layer that can be used for word lines, and may include tungsten (W).

Referring to FIG. 5I, an etching process may be performed such that portions of the third conductive layer 427 formed between the first interlayer insulating layers 409a to 409i remain and portions of the third conductive layer 427 formed in the slit trench SLT are removed. The anisotropic or isotropic etching process may be performed to remove the third conductive layer 427 formed in the slit trench SLT. For example, an anisotropic or isotropic etching process may be performed, or a wet etching process may be performed. The etching process may be performed such that a portion of the third conductive layer 427 exposed through the side surface of the slit trench SLT is over-etched, thereby forming second recesses RC2 in the side surface of the slit trench SLT. For example, the second recesses RC2 may be formed between the first interlayer insulating layers 409a to 409i exposed through the side surface of the slit trench SLT.

Referring to FIG. 5J, a spacer layer 429 may be formed on the entire structure to fill the second recesses RC2. The spacer layer 429 may be formed of a material having an etch rate different from the first sacrificial layer 407. For example, the spacer layer 429 may be formed of a nitride material, an $Al_2O_3$ material, or a stacked layer of the nitride layer and the $Al_2O_3$ layer.

Referring to FIG. 5K, an etching process may be performed to expose the first sacrificial layer 407 through a bottom surface of the slit trench SLT. In an embodiment, a dry etching process may be performed. For example, an anisotropic dry etching process may be performed. If the anisotropic dry etching process is performed, the spacer layer 429 formed over the hard mask pattern 425 and the spacer layer 429 exposed through the opening of the hard mask pattern 425 may be removed, and thus the spacer layer 429 can remain on the side surface of the slit trench SLT. The remaining spacer layer 429 becomes a spacer pattern 429p. The spacer pattern 429p can protect the third conductive layer 427, which becomes word or select lines, in a subsequent process.

Referring to FIG. 5L, an etching process may be performed to remove the first sacrificial layer 407 exposed through the bottom surface of the slit trench SLT. In an embodiment, an isotropic etching process may be performed to remove the first sacrificial layer 407 exposed through the bottom surface of the slit trench SLT. For example, a wet etching process may be performed. The wet etching process may be performed using an etchant having different etch rates with respect to the first sacrificial layer 407, the spacer pattern 429p, and the channel layer 419. For example, the wet etching process may be performed using an etchant having a high etching selection ratio with respect to the first sacrificial layer 407 and a low etching selection ratio with respect to the spacer patter 429p and the channel layer 419. When the first sacrificial layer 407 is removed by the wet etching process, the etching process may be performed such that portions of the memory layers 412 formed at lower portions of the first to third vertical holes VH1 to VH3 remain. Since the memory layers 412 remaining at the lower portions of the first to third vertical holes VH1 to VH3 are isolated from each other, the memory layers 412 may not be used as memory layers, but may be used as support layers that allow the stack structure 408 of FIG. 5 not to be inclined. When the etching process for removing the first sacrificial layer 407 is performed, a portion of the spacer pattern 429p may also be removed, and therefore, the thickness of the spacer pattern 429p may be decreased. In addition, as the first sacrificial layer 407 is removed, the buffer layer 405 may also be exposed. In this case, the buffer layer 405 may be removed together as the memory layers 412 are removed. That is, the buffer layer 405 may be used as an etch stop layer for preventing the second conductive layer 403 from being over-etched. As the first sacrificial layer 407 is removed, a third recess RC3 may be formed between the stack structure 408 and the second conductive layer 403. That is, a portion of the channel layer 419 and the second conductive layer 403 may be exposed through the third recess RC3.

Referring to FIG. 5M, a portion of the channel layer 419 and the conductive layer 403 are exposed through the third recess RC3. In this case, the channel layer 419 and the second conductive layer 403 are formed of the same material, and hence the same material layer as the channel layer 419 and the second conductive layer 403 may be selectively formed. For example, a fourth conductive layer 431 may be formed along surfaces of the channel layer 419 and the second conductive layer 403. Since both the channel layer 419 and the second conductive layer 403 are formed of polysilicon, the fourth conductive layer 431 may also be formed of polysilicon. Polysilicon of the fourth conductive layer 431 may be formed along the surfaces of the channel layer 419 and the second conductive layer 403, using a selective growth method, to fill the third recess RC3. The first conductive layer 410, the second conductive layer 403, the fourth conductive layer 431, and the channel layer 419 can be electrically connected to each other through the fourth conductive layer 431.

Referring to FIG. 5N, a slit insulating layer 433 may be formed inside the slit trench SLT. The slit insulating layer 433 may be formed of an oxide material. The space pattern 429p of FIG. 5 may be included in the slit insulating layer 433. The first conductive layer 401, the second conductive layer 403, and the fourth conductive layer 431, which are electrically connected to each other, may be used as a source line SL. The memory layers 412 adjacent to the third conductive layers 427 stacked along the first to third vertical holes VH1 to VH3 may become memory cells or select transistors, and therefore, memory cell strings may be formed along the first to third vertical holes VH1 to VH3.

As described above, any conductive layer for the source line is not formed inside the slit trench SLT between the memory cell strings, and thus it is unnecessary to consider a breakdown voltage of the third conductive layer 427 adjacent to the side surface of the slit trench SLT. Accordingly, the width of the slit trench SLT can be narrowed, thereby decreasing the size of the memory device.

Figure 6:
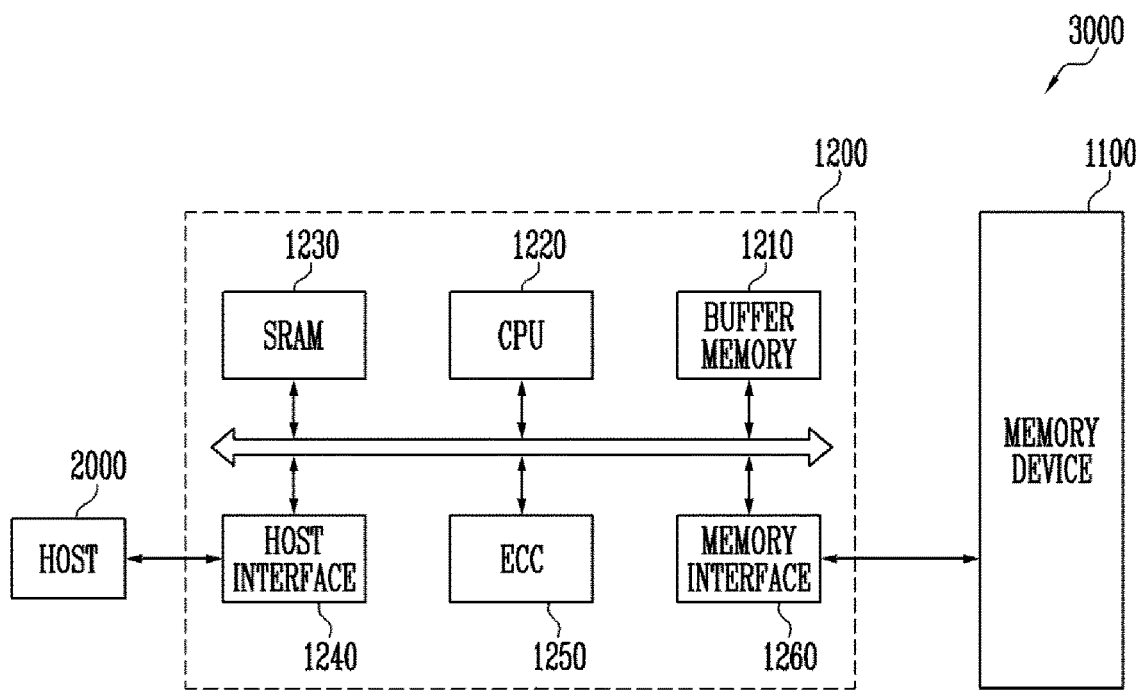
FIG. 6 is a diagram illustrating an example of a memory system according to an embodiment of the present disclosure.

FIG. 6 is a diagram illustrating an example of a memory system according to an embodiment of the present disclosure.

Referring to FIG. 6, the memory system 3000 may include a memory device 1100 for storing data therein and a memory controller 1200 for controlling the memory device 1100. Also, the memory controller 1200 may control communication between a host 2000 and the memory device 1100. The memory controller 1200 may include a buffer memory 1210, a CPU 1220, an SRAM 1230, a host interface 1240, an ECC 1250, and a memory interface 1260.

The buffer memory 1210 may temporarily store data while the memory controller 1200 is controlling the memory device 1100. The CPU 1220 may perform a control operation for data exchange of the memory controller 1200. The SRAM 1230 may be used as a working memory of the CPU 1220. The host interface 1240 may be provided with a data exchange protocol of the host 2000 connected to the memory system 3000. The ECC 1250 is an error correction unit, and may detect and correct errors included in data read out from the memory device 1100. The semiconductor interface 1260 may interface with the memory device 1100. Although not shown in FIG. 6, the memory system 3000 may further include a ROM (not illustrated) for storing code data for interfacing with the host 2000.

The host 2000 requesting read/write operations to the memory system 3000 may include a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 7:
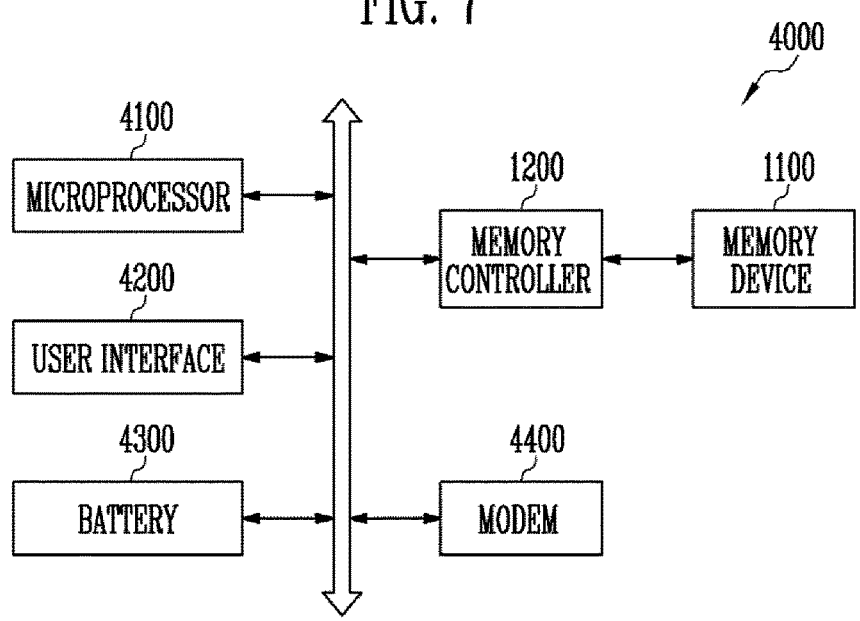
FIG. 7 is a diagram illustrating an example configuration of a computing system including a memory system according to an embodiment of the present disclosure.

FIG. 7 is a diagram illustrating an example configuration of a computing system including a memory system according to an embodiment of the present disclosure.

Referring to FIG. 7, the computing system 4000 may include a memory device 1110, a memory controller 1200, a microprocessor 4100, a user interface 4200, and a modem 4400, which are electrically connected to a bus. When the computing system 4000 is a mobile device, a battery 4300 for supplying operating voltages of the computing system 4000 may be additionally provided in the computing system 4000. Although not illustrated, the computing system 4000 may further include an application chip set, a camera image processor (CIS), a mobile DRAM, and the like. The memory controller 1200 and the memory device 1110 may constitute a solid state drive/disk (SSD).

The computing system 4000 may be packaged in various forms. For example, the computing system 4000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

In an embodiment of the present disclosure, the integration density of the memory device may be improved, thereby decreasing the size of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a memory device, the method comprising:
    forming, on a substrate, a first conductive layer, a second conductive layer, a sacrificial layer, and a stack structure;
    forming a plurality of vertical holes by etching portions of the stack structure, the sacrificial layer and the second conductive layer;
    forming a memory layer and a channel layer along internal surfaces of the vertical holes;
    forming a slit trench exposing a portion of the sacrificial layer therethrough by etching a portion of the stack structure between the vertical holes;
    exposing a portion of the channel layer and the second conductive layer through a lower portion of the stack structure by removing portions of the sacrificial layer and the memory layer;
    forming a third conductive layer along surfaces of the exposed portion of the channel layer and the second conductive layer after exposing the portion of the channel layer and the second conductive layer; and
    forming a slit insulating layer in the slit trench.

2. The method of claim 1, wherein the second and third conductive layers and the channel layer are formed of the same material as one another.

3. The method of claim 2, wherein the second and third conductive layers and the channel layer are formed of a polysilicon material.

4. The method of claim 1, wherein forming the slit trench is performed by an anisotropic etching process such that the portion of the stack structure is vertically etched.

5. The method of claim 4, wherein the anisotropic etching process includes an anisotropic dry etching process.

6. The method of claim 1, wherein an isotropic etching process is performed such that at least the portion of the sacrificial layer and the portion of the memory layer are removed.

7. The method of claim 6, wherein the isotropic etching process is performed by a wet etching process or dry etching process.

8. The method of claim 6, wherein the isotropic etching process is performed using a material having a high etch rate with respect to the sacrificial layer.

9. The method of claim 1, wherein the third conductive layer is selectively grown along surfaces of the channel layer and the second conductive layer.

10. The method of claim 1, further comprising, before the portions of the sacrificial layer and the memory layer are removed, forming a spacer pattern on a partial side surface of the slit trench.

11. The method of claim 10, wherein the spacer pattern is formed on side surfaces of fourth conductive layers, which are included in the stack structure, exposed through the side surface of slit trench among insulating layers and the fourth conductive layers.

12. The method of claim 10, wherein the spacer pattern is formed of a material having an etch rate different from the sacrificial layer.

13. The method of claim 12, wherein the spacer pattern is formed of a nitride layer, an Al2O3 layer, or a stacked layer of the nitride layer and the Al2O3 layer.

14. The method of claim 1, wherein an upper surface of the first conductive layer is flat.

15. The method of claim 1, wherein an upper surface of the second conductive layer is uneven by exposing the portion of the channel layer and the second conductive layer.

* * * * *